United States Patent
Wang et al.

(10) Patent No.: US 7,286,347 B2
(45) Date of Patent: Oct. 23, 2007

(54) ELECTRONIC DEVICE HAVING A TEMPERATURE CONTROL SYSTEM

(75) Inventors: Jian Wang, Goleta, CA (US); Gang Yu, Santa Barbara, CA (US)

(73) Assignee: DuPont Displays, Santa Barbara, CA (US)

( * ) Notice: Subject to any disclaimer, the term of this patent is extended or adjusted under 35 U.S.C. 154(b) by 264 days.

(21) Appl. No.: 10/914,813

(22) Filed: Aug. 10, 2004

(65) Prior Publication Data

US 2006/0034050 A1  Feb. 16, 2006

(51) Int. Cl.
*H05K 7/20* (2006.01)

(52) U.S. Cl. .............. 361/695; 361/690; 361/691; 454/184; 313/46; 313/582

(58) Field of Classification Search ............. 361/687, 361/688, 690–695, 714–719; 165/80.3, 165, 165/185, 121, 122, 104.33; 454/184; 349/58, 349/60, 61; 345/82–87, 156, 905; 313/17, 313/46, 582, 584; 353/122

See application file for complete search history.

(56) References Cited

U.S. PATENT DOCUMENTS

| | | | |
|---|---|---|---|
| 4,904,079 A * | 2/1990 | Yoshimura et al. ......... 353/122 |
| 5,183,323 A | 2/1993 | Daniel |
| 5,207,505 A | 5/1993 | Naraki et al. |
| 5,402,312 A * | 3/1995 | Kinjo et al. ................. 361/695 |
| 5,508,782 A | 4/1996 | Koh et al. |
| 5,634,711 A | 6/1997 | Kennedy et al. |
| 5,831,816 A | 11/1998 | Johns et al. |
| RE36,060 E | 1/1999 | Miyashita |
| 5,907,222 A | 5/1999 | Lengyel et al. |
| 6,007,205 A | 12/1999 | Fujimori |
| 6,104,451 A | 8/2000 | Matsuoka et al. |
| H1876 H | 10/2000 | Knox et al. |
| 6,181,070 B1 | 1/2001 | Dunn et al. |
| 6,181,553 B1 | 1/2001 | Cipolla et al. |
| 6,198,222 B1 * | 3/2001 | Chang ........................ 313/582 |
| 6,255,786 B1 | 7/2001 | Yen |
| 6,265,820 B1 | 7/2001 | Ghosh et al. |
| 6,353,295 B1 | 3/2002 | Sridhar et al. |
| 6,417,832 B1 | 7/2002 | Skinner et al. |
| 6,469,449 B1 | 10/2002 | Leung et al. |

(Continued)

FOREIGN PATENT DOCUMENTS

GB  514003  10/1939

(Continued)

*Primary Examiner*—Michael Datskovskiy

(57) ABSTRACT

An electronic device includes a targeted area within the electronic device. The targeted area includes a first side and a second side that is different from the first side. A first fan lies along the first side. Also, a second fan lies along the second side. The first fan and the second fan are both inlet fans or are both outlet fans. A method of using an electronic device is provided and includes directing a first fluid flow from the first fan along the targeted area. The method includes directing a second fluid flow from the second fan along the targeted area. The direction of the second fluid flow is different than the direction of the first fluid flow. Also, a turbulent fluid flow is created at least partially based on the first fluid flow, the second fluid flow, or a combination thereof.

8 Claims, 2 Drawing Sheets

U.S. PATENT DOCUMENTS

| | | |
|---|---|---|
| 6,476,560 B2 | 11/2002 | Terami et al. |
| 6,476,883 B1 * | 11/2002 | Salimes et al. ............... 349/58 |
| 6,575,599 B1 | 6/2003 | Imamura et al. |
| 6,671,177 B1 | 12/2003 | Han |
| 6,693,381 B2 | 2/2004 | Bell et al. |
| 6,775,134 B2 * | 8/2004 | Chen .......................... 361/687 |
| 2003/0147036 A1 | 8/2003 | Kaise et al. |

FOREIGN PATENT DOCUMENTS

JP      2000132112 A  *  5/2000

* cited by examiner

ELECTRONIC DEVICE HAVING A TEMPERATURE CONTROL SYSTEM

FIELD OF THE INVENTION

The invention relates in general to electronic devices, and more particularly to electronic devices having temperature control systems.

BACKGROUND INFORMATION

Electronic devices, including organic electronic devices, continue to be used more extensively in everyday life. Examples of organic electronic devices include Organic Light-Emitting Diode ("OLED") displays. Due to the sensitivity to moisture and oxygen of the organic materials (e.g., transport materials, emissive materials) and the cathode materials used in organic electronic devices, these devices typically have rigorous package requirements for practical applications. Two types of packaging structures adopted for organic electronic devices include (1) a sealing can with an air gap and solid-state desiccants and (2) a thick metal solder layer directly attached to a common cathode. The sealing may include glass and ceramic materials, metals and metal alloys, other materials that prevent significant diffusion of moisture or oxygen, and combinations thereof. As will be described below, either or both packaging structures may not provide sufficient heat dissipation.

The radiation emission efficiencies of OLED pixels are typically in a range of approximately one to twenty candelas per ampere (1-20 cd/A). For a full-color display with a fifty percent (50%) aperture ratio and with a circular polarizer with approximately forty percent (40%) optical transmission, the pixel current density is in a range of approximately thirty to six hundred milliamperes per square centimeters (30-600 mA/cm$^2$) for an emission intensity of approximately 400 cd/m$^2$. At an operation voltage of approximately five volts (5 V), the corresponding input electric power density is in a range of approximately 0.15-3.0 watts per square centimeter (W/cm$^2$). Aside from the conversion into light energy for light emission, much of the input electrical energy is converted into heat. When thermal conduction from the emission layer to the surroundings is not sufficient, substantial panel heating will occur.

A conventional active matrix ("AM") driven device includes a common cathode. This common electrode layer can be subjected to high current density when the display size is large or when the emission intensity increases above certain levels. In such cases, if the heat flowing from the radiation-emitting region to the ambient air is insufficient, a significant temperature rise will also take place in the device. In particular, the operation lifetime of OLED devices is dependent on operation temperatures. For example, devices with emissive layers using poly(phenylenevinylene) (PPV) derivatives with yellow or orange colors, the operation lifetime can be approximately 35 times shorter at 80° C. than at 25° C. Other electronic devices may experience reduced lifetimes due to higher operating temperature.

In a conventional OLED device, the common cathode can be covered by an epoxy layer and glass sheet. Another conventional OLED device can be covered by a metal cap that has a desiccant. The metal cap is attached using an adhesive. These OLED devices may have thermal resistance coefficients that are typically greater than 150° C. cm$^2$/W . The corresponding temperature rise of the radiation-emitting electronic components could be higher than 10° C. when operating at 200 cd/m$^2$ for a display having an area of approximately 3-6 cm$^2$. Outdoor display applications and lighting panels can have emission intensities of 500-2000 cd/m$^2$ and 2000-5000 cd/m$^2$, respectively. AM-driven OLED displays in such applications may not be stably operated at such high brightness levels, and the device temperature may not even be stabilized due to insufficient heat flow out of the device (a phenomenon known as thermal run-off).

Heat dissipation issues are not unique to organic electronic devices. Inorganic (e.g., silicon-based) integrated circuits ("ICs") can generate significant amounts of heat. Most notable are microprocessors (e.g., Intel Pentium™, AMD Athlon™, IBM PowerPC™ processors) due to their power requirements.

SUMMARY OF THE INVENTION

An electronic device includes a targeted area within the electronic device. The targeted area includes a first side and a second side that is different from the first side. A first fan lies along the first side. Also, a second fan lies along the second side. The first fan and the second fan are both inlet fans or are both outlet fans.

In another embodiment, a method of using an electronic device is provided. The electronic device includes a targeted area within the electronic device, a first fan, and a second fan. The method includes directing a first fluid flow from the first fan along the targeted area. Also, the method includes directing a second fluid flow from the second fan along the targeted area. The direction of the second fluid flow is different than the direction of the first fluid flow. Also, a turbulent fluid flow is created at least partially based on the first fluid flow, the second fluid flow, or a combination thereof. Further, the turbulent fluid flow is adjacent to the targeted area.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
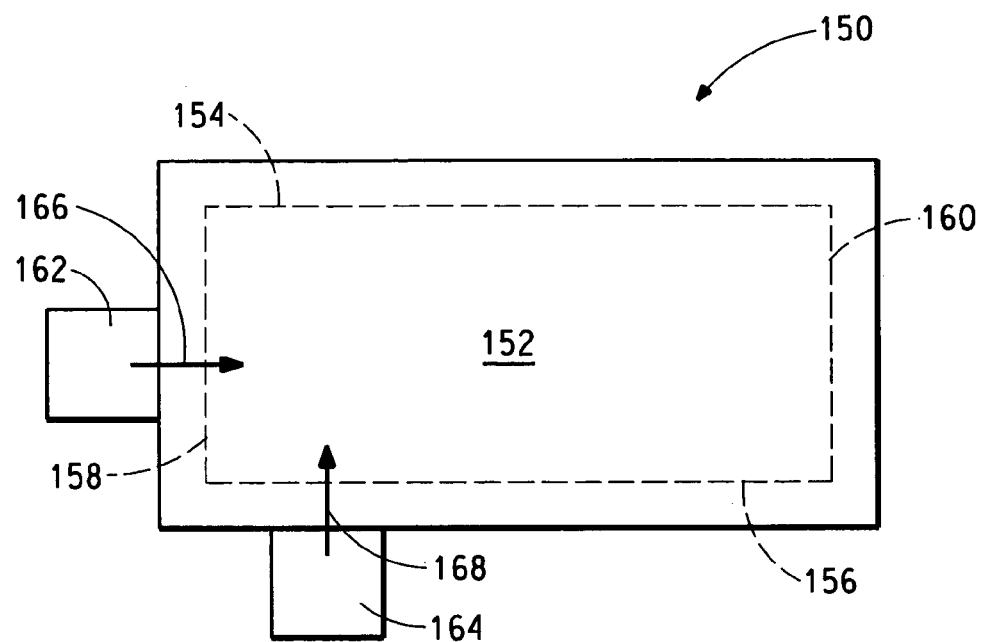
FIG. 1 is a plan view of a first embodiment of a fan arrangement for an electronic device.

Skilled artisans appreciate that features in the figures are illustrated for simplicity and clarity and have not necessarily been drawn to scale. For example, the dimensions of some of the features in the figures may be exaggerated relative to other features to help to improve understanding of embodiments of the invention.

DETAILED DESCRIPTION

In one embodiment, an electronic device includes a targeted area within the electronic device. The targeted area includes a first side and a second side different from the first side. A first fan lies along the first side and a second fan lies along the second side.

In a particular embodiment, the first side and the second side lie along adjacent sides of the targeted area. Alternatively, the first side and the second side lie along substantially opposite sides of the targeted area. In a particular embodiment, the electronic device further includes a third fan that lies along the first side and a fourth fan that lies along the second side.

In another embodiment, the targeted area also includes a third side and a fourth side that is substantially opposite the third side. Moreover, the third side and the fourth side are substantially perpendicular to the first side and the second side. In this particular embodiment, the electronic device further includes a third fan and a fourth fan. Additionally, the third fan lies along the third side and the fourth fan lies along the fourth side.

In another embodiment, a method of using an electronic device is provided. The electronic device includes a targeted area within the electronic device, a first fan, and a second fan. The method includes directing a first fluid flow from the first fan along the targeted area. Also, the method includes directing a second fluid flow from the second fan along the targeted area. The direction of the second fluid flow is different than the direction of the first fluid flow. Also, a turbulent fluid flow is created at least partially based on the first fluid flow, the second fluid flow, or a combination thereof. Further, the turbulent fluid flow is adjacent to the targeted area.

In a particular embodiment, the direction of the first fluid flow is substantially perpendicular to the direction of the second fluid flow. Alternatively, the first fluid flow is substantially parallel to the direction of the second fluid flow.

In still another embodiment, the electronic device further includes a third fan that is configured to provide a third fluid flow substantially parallel to the targeted area and a fourth fan that is configured to provide a fourth fluid flow substantially parallel to the targeted area. A direction of the third fluid flow is different than a direction of the fourth fluid flow. A turbulent fluid flow is created based on the third fluid flow and the fourth fluid flow and the turbulent fluid flow is adjacent to the targeted area.

In a particular embodiment, the third fluid flow is substantially, parallel to the fourth fluid flow. In another embodiment, the third fluid flow is substantially opposite the first fluid flow and the fourth fluid flow is substantially opposite the second fluid flow. Alternatively, the first fluid flow is substantially toward the second fluid flow and the third fluid flow is substantially opposite the fourth fluid flow.

In each of the embodiments described above, the first fan and the second fan can both be inlet fans or they can both be outlet fans. Also, the third fan and the fourth fan can both be outlet fans or they can both be inlet fans. Further, each of the electronic devices can further include an array of organic electronic components that comprise an organic active layer.

The detailed description first addresses Definitions and Clarification of Terms followed by Structures, Materials, and Configurations; Temperature Control Systems Including Fan and Other Arrangements; Other Embodiments; and finally, Advantages.

1. Definitions and Clarification of Terms

Before addressing details of embodiments described below, some terms are defined or clarified. As used herein, the term "active" when referring to a layer or material is intended to mean a layer or material that has electronic or electro-radiative properties. An active layer material may emit radiation or exhibit a change in concentration of electron-hole pairs when receiving radiation.

The terms "array," "peripheral circuitry," and "remote circuitry" are intended to mean different areas or components of an electronic device. For example, an array may include a number of pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "direction," when referring to a fluid flow, is intended to mean an angular orientation of the fluid flow with respect to a zero degree axis. The direction of each fluid flow is indicated in a common plane with respect to a common zero axis.

The term "electronic component" is intended to mean a lowest level unit of a circuit that performs an electrical function. An electronic component may include a transistor, a diode, a resistor, a capacitor, an inductor, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the proper potential(s), performs a function. An electronic device may include or be part of a system. Examples of electronic devices include displays, sensor arrays, computer systems, avionics, automobiles, cellular phones, and many other consumer and industrial electronic products.

The term "fan" is intended to mean a device having at least one moving part for creating or assisting a flow of a fluid. Fan should be broadly construed to include a muffin fan, a pump, and the like.

The term "fluid" is intended to mean a liquid, a gas, a supercritical fluid, or any combination thereof. A fluid may include one material or a combination of materials.

The term "inlet," when used as an adjective, is intended to modify an object (e.g., a fan, an end of a channel, a manifold, etc.) and to refer to a point, area, or region adjacent to where a fluid (1) enters a structure (e.g., a channel, a manifold, ductwork assembly, etc.), (2) moves closer to a center of a targeted area, or (3) a combination thereof.

The term "organic electronic device" is intended to mean a device including one or more organic semiconductor layers or materials. Organic electronic devices include: (1) devices that convert electrical energy into radiation (e.g., a light-emitting diode, light-emitting diode display, diode laser, or lighting panel), (2) devices that detect signals through electronic processes (e.g., photodetectors (e.g., photoconductive cells, photoresistors, photoswitches, phototransistors, phototubes), infrared ("IR") detectors, biosensors), (3) devices that convert radiation into electrical energy (e.g., a photovoltaic device or solar cell), and (4) devices that include one or more electronic components that include one or more organic semiconductor layers (e.g., a transistor or diode).

The term "outlet," when used as an adjective, is intended to modify an object (e.g. a fan, an end of a channel, a manifold, etc.) and to refer to a point, area, or region adjacent to where a fluid (1) leaves a structure (e.g., a channel, a manifold, ductwork assembly, etc.), (2) moves further from a center of a targeted area, or (3) a combination thereof.

The term "targeted area" is intended to mean an area that is intended to be cooled, heated, maintained at a substantially constant temperature, or any combination of thereof.

As used herein, the terms "comprises," "comprising," "includes," "including," "has," "having" or any other variation thereof, are intended to cover a non-exclusive inclusion. For example, a process, article, or apparatus that comprises a list of features is not necessarily limited only those features but may include other features not expressly listed or inherent to such process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductor arts.

2. Structures. Materials, and Configurations

Electronic devices, including organic electronic devices, can generate significant amounts of heat during operation. By improving the heat dissipation of the electronic device, the electronic device can operate under a wide variety of operating conditions without more than a 10° C. rise in temperature compared to the ambient temperature. The temperature can be measured at an external surface of the electronic device. For example, the temperature may be measured at the user side of a substrate from which a display has been fabricated. An IR measuring instrument can measure the temperature of a display or lighting panel. The IR measuring instrument may include one or more filters so that visible light from a display or a lighting panel does not significantly interfere with the temperature measurements. Alternatively, no visible light filter may be used with the IR measuring instrument. A first temperature of the substrate along the user side (the side in contact with the air) of the organic electronic device can be measured after the device has been operating for at least a minute. A second temperature of the substrate along the user side is measured after the device has been turned off (not emitting radiation or light) for at least 15 minutes. The difference between the first and second temperatures may be no more than 10° C.

The mechanism for heat dissipation may be any one or more of thermal conduction, convection, and radiation. Thermal conduction and radiation are addressed in U.S. patent application Ser. No. 10/683,828 filed on Oct. 10, 2003 (Yu et al.).

Improved heat transfer may be achieved by using a temperature control system in which a component of the temperature control system is thermally coupled to a targeted area of an electronic device (e.g., a common electrode used in organic electronic components). The temperature control system can include a fan, a ductwork assembly, or a combination of the two, thermally coupled to a targeted area within the electronic device that is to be cooled to a particular temperature, maintained at a particular temperature, or within a desired temperature range, or any combination thereof using a heat transfer fluid at or near a targeted area of the electronic device. In one embodiment, the temperature control system can be used to cool the electronic device. In another embodiment, the temperature control system can be used to heat the electronic device. In one embodiment, fan arrangements can be used to increase the likelihood of turbulence, which may increase the heat transfer rate.

3. Temperature Control Systems Including Fan and Other Arrangements

FIG. 1 through FIG. 4 portray various fan arrangements that can be useful for creating turbulent flow in a heat transfer fluid flowing across a targeted area of an electronic device. The turbulent flow can increase the heat transfer to the heat transfer fluid.

Referring to FIG. 1, a first embodiment of a fan arrangement for an electronic device is illustrated. FIG. 1 depicts an electronic device 150 that includes a targeted area 152. In one embodiment, the electronic device includes an AMOLED display, and the targeted area corresponds to a common electrode or heat sink attached to a common electrode of the AMOLED display. In other embodiments, the targeted area can include a different area where heat transfer is to be increased. The targeted area 152 defines a first side 154 and a second side 156 that is substantially opposite the first side 154. The second side 156 is substantially parallel to the first side 154. Moreover, the targeted area 152 includes a third side 158 and a fourth side 160 that are substantially opposite each other and substantially perpendicular to the first side 154 and the second side 156. FIG. 1 further depicts a first fan 162 that is disposed along the third side 158 of the targeted area 152. A second fan 164 is disposed along the second side 156 of the targeted area 152 so that it is substantially perpendicular to the first fan 162.

In one embodiment, the first fan 162 and the second fan 164 are oriented so that the fluid flow caused by the first fan 162, represented by arrow 166, is substantially perpendicular to the fluid flow caused by the second fan 164, represented by arrow 168. Thus, the fluid flow caused by each fan 162, 164 converges to create a turbulent flow across the targeted area 152. The turbulent flow helps dissipate heat adjacent to the targeted area 152. Compared to laminar fluid flow (which may occur when inlet fans, outlet fans, or both are oriented to cause flow principally in the same direction), the turbulent fluid flow can be advantageous in that it assists greatly in improving the heat transfer of the heat transfer fluid flowing over the targeted area. As such, greater heat can be absorbed and removed by the heat transfer fluid flowing over the targeted area.

In one embodiment, as illustrated in FIG. 1, the fans 162,164 are both inlet fans, and in another embodiment they are both outlet fans. In the case where the fans 162, 164 are outlet fans the fluid flow represented by arrow 166 and arrow 168 would be reversed to indicate fluid flow into each fan. In either case, a turbulent flow can be created adjacent to the targeted area. In another embodiment, the fans 162,164 can point in other directions, however, the flow patterns for the fans 162,164 cross over the targeted area 152 in one embodiment.

Figure 2:
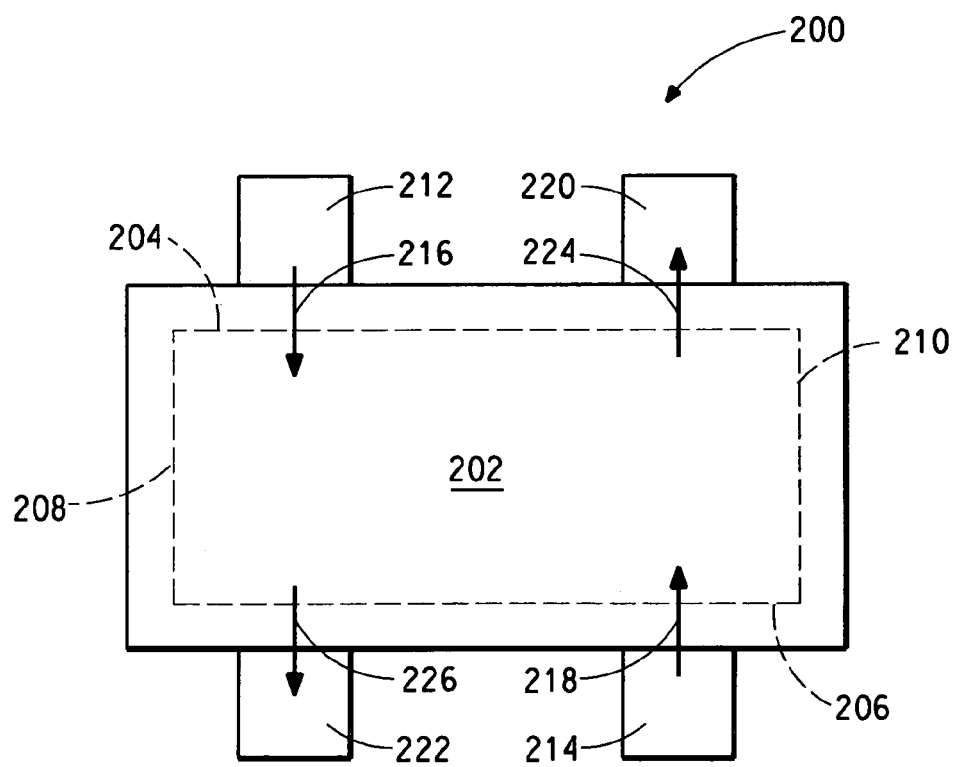
FIG. 2 is a plan view of a second embodiment of a fan arrangement for an electronic device.

FIG. 2 depicts a second embodiment of a fan arrangement for an electronic device. As illustrated in FIG. 2, an electronic device 200 is provided and includes a targeted area 202. The targeted area 202 defines a first side 204 and a second side 206 substantially opposite the first side 204. The second side 206 is substantially parallel to the first side 204. Moreover, the targeted area 202 includes a third side 208 and a fourth side 210 that are substantially opposite each other and substantially perpendicular to the first side 204 and second side 206. FIG. 2 further illustrates a first fan 212 that is disposed along the first side 204 of the targeted area 202 such that it is closer to the third side 208 than the fourth side 210 of the targeted area 202. A second fan 214 is also disposed along the second side 206 of the targeted area 202 so that it is closer to the fourth side 210 of the targeted area 202 than the third side 208 of the targeted area 202.

In the embodiment as illustrated in FIG. 2, the first fan 212 and the second fan 214 are oriented so that the fluid flow caused by the first fan 212, represented by arrow 216, is substantially parallel but substantially opposite the fluid flow caused by the second fan 214, represented by arrow 218. Also, the fluid flow caused by the first fan 212 is distanced from the fluid flow caused by the second fan 214. Thus, the fluid flow caused by each fan, or a combination thereof, can create a turbulent flow across the targeted area 202. The turbulent flow of the heat transfer fluid increases heat transfer adjacent to the targeted area 202.

FIG. 2 further depicts a third fan 220 that is placed along the first side 204 of the targeted area 202 substantially opposite the second fan 214. A fourth fan 222 is placed along the second side 206 of the targeted area 202 substantially opposite the first fan 212. As illustrated in FIG. 2, the fluid flow caused by the third fan 220, represented by arrow 224, is substantially aligned with the fluid flow from the second fan 214. Further, the fluid flow caused by the fourth fan 222 is substantially aligned with the fluid flow caused by the first fan 212. The additional fluid flow provided by the third and fourth fans 220, 222 helps strengthen the creation of the eddy flow adjacent to the targeted area 202.

In one embodiment, the first fan 212 and the second fan 214 are inlet fans, and in another embodiment, they are outlet fans. In the case where the fans 212, 214 are outlet fans the fluid flow represented by arrow 216 and 218 would be reversed to indicate fluid flow into each fan. Additionally, the third fan 220 and the fourth fan 222 are either both inlet fans or they are both outlet fans. In the case where the third fan 220 and the fourth fan 222 are inlet fans the fluid flow represented by arrow 224 and arrow 226 would be reversed to indicate fluid flow from each fan 220, 222.

Figure 3:
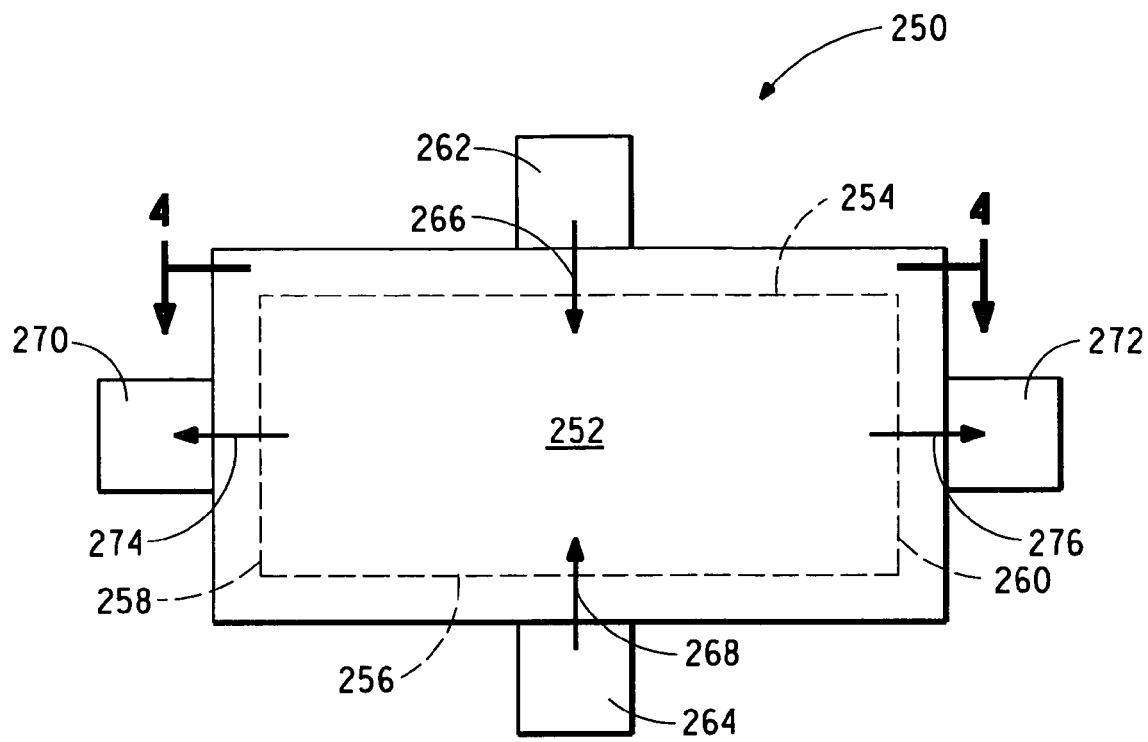
FIG. 3 is a plan view of a third embodiment of a fan arrangement for an electronic device.

Referring now to FIG. 3, a third embodiment of a fan arrangement for an electronic device is illustrated. FIG. 3 depicts an electronic device 250 that includes a targeted area 252 that defines a first side 254 and a second side 256 substantially opposite the first side 254. The second side 256 is substantially parallel to the first side 254. Moreover, the targeted area 252 includes a third side 258 and a fourth side 260 that are substantially opposite each other and substantially perpendicular to the first side 254 and the second side 256. FIG. 3 further depicts a first fan 262 that is substantially centrally disposed along the first side 254 of the targeted area 252. A second fan 264 is substantially centrally disposed along the second side 256 of the targeted area 252 so that it is substantially opposite the first fan 262.

In the embodiment as illustrated in FIG. 3, the first fan 262 and the second fan 264 are oriented so that the fluid flow caused by the first fan 262, represented by arrow 266, is aligned with, but substantially opposite to, the fluid flow caused by the second fan 264, represented by arrow 268. Thus, the fluid flows caused by the first fan 262 and the second fan 264 converge adjacent to the targeted area 252 to create turbulent flow adjacent to the targeted area 252. The turbulent flow helps heat transfer to or from the targeted area 252.

FIG. 3 further depicts a third fan 270 that is substantially centrally placed along the third side 258 of the targeted area 252 so that it is substantially perpendicular to the first fan 262 and the second fan 264. Moreover, a fourth fan 272 is substantially centrally located along the fourth side 260 of the targeted area so that it is substantially opposite the third fan 270. As illustrated in FIG. 5, the fluid flow caused by the third fan 270, represented by arrow 274, is substantially aligned with, but substantially opposite to, the fluid flow from the fourth fan 272, represented by arrow 276. The additional fluid flow provided by the third fan 270 and the fourth fan 272 helps bolster the creation of turbulent flow adjacent to the targeted area 252.

In one embodiment, the first fan 262 and the second fan 264 are inlet fans, and in another embodiment, they are outlet fans. In the case where the fans 262, 264 are outlet fans the fluid flow represented by arrow 266 and 268 would be reversed to indicate fluid flow into each fan. Additionally, in one embodiment, the third fan 270 and the fourth fan 272 are inlet fans, and in another embodiment, they are outlet fans. In the case where the third fan 270 and the fourth fan 272 are inlet fans the fluid flow represented by arrow 274 and arrow 276 would be reversed to indicate fluid flow from these fans 270, 272.

Figure 4:
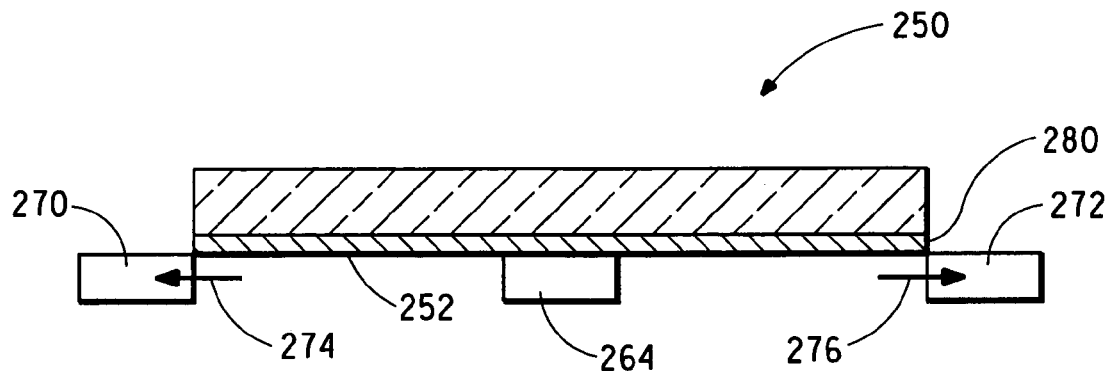
FIG. 4 is a cross-section view of the third embodiment of a fan arrangement for an electronic device taken along line 4-4 in FIG. 3.

FIG. 4 illustrates a cross-section view of the third embodiment of the fan arrangement represented in FIG. 3. As depicted in FIG. 4, the fluid flow, represented by arrow 274, from the third fan 270 is substantially parallel to the surface of the targeted area 252. Similarly, the fluid flow, represented by arrow 276, from the fourth fan 272 is substantially parallel to the surface of the targeted area 252. After reading this specification, skilled artisans will appreciate that the fluid flow from each of the fans described in conjunction with FIG. 1 through FIG. 4 flow is substantially parallel to the respective targeted areas. FIG. 4 further illustrates that the electronic device 250 can include a common electrode 280 and that the targeted area 252 can be any portion or all of a surface of the common electrode 280.

Further, after reading this specification, skilled artisans will appreciate that many other embodiments are possible. Any of the fans may be replaced by a plurality of fans. Also, the actual placement of fans is not critical. The placement and orientation of the fans may help to increase the likelihood that turbulent flow will occur with the heat transfer fluid (e.g., air) at or near the targeted area. However, the placement of the fans or the flow rates of the fans may help substantially prevent the occurrence of turbulent flow at or near the targeted area. Further, in one embodiment, the direction of the fluid flow exiting one or more fans in each of the embodiments shown in FIGS. 1 through 4 may be reversed in order to achieve laminar flow and substantially prevent turbulent flow. After reading this specification, skilled artisans will also appreciate that the fans shown in each of the embodiments shown in FIGS. 1 through 4 may have an air intake or exhaust that is oriented substantially perpendicular or substantially parallel to the direction of fluid flow shown therein. In other words, the fans may draw air from the front of the display, the back of the display, or the sides of the display, or may expel air to the front of the display, the back of the display, or the sides of the display.

4. Other Embodiments

The fan arrangements described above may be used with nearly any electronic device that is to be heated, cooled, maintained at a substantially constant temperature or within a desired temperature range, or any combination thereof. Many of the systems described may be useful in other applications. For example, a liquid crystal ("LCD") display may not operate very well at temperatures below 5° C. However, the LCD display may be in a location where it is exposed to temperatures below freezing. One or more of the temperature control systems may be modified to use a heat transfer fluid that heats the display to allow its use when an ambient temperature is below freezing. In still another embodiment, a fan arrangement may be used to maintain a targeted area of the electronic device at substantially constant temperature. Modifications of one or more of the fan arrangements above may allow for better control.

The fan arrangements as described above can be used for different types of electronic devices and are not limited to displays. Moreover, the fan arrangements may be used for computers, controllers, thermal sensors, and a wide variety of electronic devices. Organic electronic devices tend to be more sensitive to temperature increases above room temperature compared to inorganic electronic devices. In addition to radiation-emitting electronic components, such as OLEDs, the temperature control systems described herein can be useful for radiation-responsive electronic components, and other electronic components that include an organic active layer. Ductwork assemblies that are useful for cooling different types of electronic devices are addressed in Attorney Docket Number UC0418 entitled: "Electronic Device Having A Temperature Control System" by Wang et al. incorporated herein by reference and filed simultaneously herewith.

5. Advantages

Embodiments described herein have benefits compared to conventional devices. For example, as illustrated in FIG. 1, the arrangement of a first fan 162 substantially perpendicular to a second fan 164 can be operated to create turbulent flow across a targeted area 152 as the fans operate. The turbulent flow increases the heat transfer between the targeted area 152 and the heat transfer fluid that is flowing across the targeted area 152. Moreover, the arrangement of a first fan and a second fan so that they are blowing toward each other, either at a distance from a central axis, as shown in FIG. 2, or directly at each other, as shown in FIG. 3, can create turbulent flow across a targeted area.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An electronic device comprising:
   a targeted area within the electronic device, wherein the targeted area includes a first side and a second side different from the first side;
   a first fan lying along the first side, oriented to cause a first fluid flow; and
   a second fan lying along the second side, oriented to cause a second fluid flow;
   wherein the first side and the second side lie along substantially opposite sides of the targeted area and the first fluid flow is substantially parallel but opposed to the direction of the second fluid flow;
   wherein the first fan and the second fan are both inlet fans;
   a third fan and a fourth fan, wherein:
   the targeted area has a third side and a fourth side substantially opposite the third side;
   the third side and the fourth side are substantially perpendicular to the first side and the second side;
   the third fan lies along the third side;
   the fourth fan lies along the fourth side; and
   the respective fluid flow caused by each fan converges to create a turbulent flow across the targeted area.

2. The electronic device of claim 1, wherein the third fan and the fourth fan are outlet fans.

3. A method of using an electronic device, wherein the electronic device Comprises a targeted area within the electronic device, a first fan, and a second fan, wherein the first and second fans are inlet fans, the method Comprising:
   directing a first fluid flow from the first fan along the targeted area;
   directing a second fluid flow from the second fan along the targeted area;
   wherein:
   a direction of the second fluid flow is different than a direction of the first fluid flow;
   a turbulent fluid flow is created at least partially based on the first fluid flow, the second fluid flow, or a combination thereof; and
   the turbulent fluid flow is adjacent to the targeted area.

4. A method of using an electronic device, wherein the electronic device comprises a targeted area within the electronic device, a first fan, and a second fan, the method comprising:
   directing a first fluid flow from the first fan along the targeted area;
   directing a second fluid flow from the second fan along the targeted area;
   wherein:
   a direction of the second fluid flow is different than a direction of the first fluid flow;
   a turbulent fluid flow is created at least partially based on the first fluid flow, the second fluid flow, or a combination thereof; and
   the turbulent fluid flow is adiacent to the targeted area,
   wherein the first fan and the second fan are inlet fans.

5. A method of using an electronic device, wherein the electronic device comprises a targeted area within the electronic device, a first fan, a second fan, a third fan, and a fourth fan, the method comprising:

directing a first fluid flow from the first fan along the targeted area;
directing a second fluid flow from the second fan along the targeted area;
wherein:
  a direction of the second fluid flow is different than a direction of the first fluid flow;
  a turbulent fluid flow is created at least partially based on the first fluid flow, the second fluid flow, or a combination thereof; and
  the turbulent fluid flow is adjacent to the targeted area;
directing a third fluid flow from the third fan along the targeted area;
directing a fourth fluid flow from the fourth fan along the targeted area;
wherein:
  a direction of the third fluid flow is different than a direction of the fourth fluid flow;
  a turbulent fluid flow is created at least partially based on the first fluid flow, the second fluid flow, the third fluid flow, the fourth fluid flow, or a combination thereof; and
  the turbulent fluid flow is adjacent to the targeted area; and
wherein the third fluid flow is substantially parallel to the fourth fluid flow.

6. A method of using an electronic device, wherein the electronic device comprises a targeted area within the electronic device, a first fan, a second fan, a third fan, and a fourth fan, the method comprising:
directing a first fluid flow from the first fan along the targeted area;
directing a second fluid flow from the second fan along the targeted area;
wherein:
  a direction of the second fluid flow is different than a direction of the first fluid flow;
  a turbulent fluid flow is created at least partially based on the first fluid flow, the second fluid flow, or a combination thereof; and
  the turbulent fluid flow is adjacent to the targeted area;
directing a third fluid flow from the third fan along the targeted area;
directing a fourth fluid flow from the fourth fan along the targeted area;
wherein:
  a direction of the third fluid flow is different than a direction of the fourth fluid flow;
  a turbulent fluid flow is created at least partially based on the first fluid flow, the second fluid flow, the third fluid flow, the fourth fluid flow, or a combination thereof;
  the turbulent fluid flow is adjacent to the targeted area; and
wherein the third fan and the fourth fan are inlet fans.

7. A method of using an electronic device, wherein the electronic device comprises a targeted area within the electronic device, a first fan, a second fan, a third fan, and a fourth fan, the method comprising:
directing a first fluid flow from the first fan along the targeted area;
directing a second fluid flow from the second fan along the targeted area;
wherein:
  a direction of the second fluid flow is different than a direction of the first fluid flow;
  a turbulent fluid flow is created at least partially based on the first fluid flow, the second fluid flow, or a combination thereof; and
  the turbulent fluid flow is adjacent to the targeted area;
  a third fan and a fourth fan; and
directing a third fluid flow from the third fan along the targeted area;
directing a fourth fluid flow from the fourth fan along the targeted area;
wherein:
  a direction of the third fluid flow is different than a direction of the fourth fluid flow;
  a turbulent fluid flow is created at least partially based on the first fluid flow, the second fluid flow, the third fluid flow, the fourth fluid flow, or a combination thereof;
  the turbulent fluid flow is adjacent to the targeted area; and
wherein the third fluid flow is substantially opposite the first fluid flow and the fourth fluid flow is substantially opposite the second fluid flow.

8. A method of using an electronic device, wherein the electronic device comprises a targeted area within the electronic device, a first fan, a second fan, a third fan, and a fourth fan, the method comprising:
directing a first fluid flow from the first fan along the targeted area;
directing a second fluid flow from the second fan along the targeted area;
wherein:
  a direction of the second fluid flow is different than a direction of the first fluid flow;
  a turbulent fluid flow is created at least partially based on the first fluid flow, the second fluid flow, or a combination thereof; and
  the turbulent fluid flow is adjacent to the targeted area;
  a third fan and a fourth fan; and
directing a third fluid flow from the third fan along the targeted area;
directing a fourth fluid flow from the fourth fan along the targeted area;
wherein:
  a direction of the third fluid flow is different than a direction of the fourth fluid flow;
  a turbulent fluid flow is created at least partially based on the first fluid flow, the second fluid flow, the third fluid flow, the fourth fluid flow, or a combination thereof;
  the turbulent fluid flow is adjacent to the targeted area; and
wherein the third fluid flow is substantially toward the first fluid flow and the fourth fluid flow is substantially toward the second fluid flow.

* * * * *